US010623007B1

(12) United States Patent
Kong et al.

(10) Patent No.: US 10,623,007 B1
(45) Date of Patent: Apr. 14, 2020

(54) ENERGY-EFFICIENT CHARGE PUMP DESIGN FOR PHASE-LOCKED LOOPS

(71) Applicant: Apple Inc., Cupertino, CA (US)

(72) Inventors: Robert K. Kong, San Francisco, CA (US); Shaobo Liu, Sunnyvale, CA (US); Dennis M. Fischette, Jr., Mountain View, CA (US); Patrick J Landy, Melbourne, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/242,800

(22) Filed: Jan. 8, 2019

(51) Int. Cl.
*H03L 7/089* (2006.01)
(52) U.S. Cl.
CPC .................. *H03L 7/0895* (2013.01)
(58) Field of Classification Search
CPC ... H03L 7/0891; H03L 7/0893; H03L 7/0895; H03L 7/0896; H03L 7/0898
USPC ............ 327/147–163, 536, 538–543; 331/17
See application file for complete search history.

(56) References Cited

U.S. PATENT DOCUMENTS

| 6,169,458 | B1 | 1/2001 | Shenoy et al. |
| 7,057,465 | B2 | 6/2006 | Wakayama |
| 8,063,678 | B2 | 11/2011 | Wadhwa et al. |
| 8,222,937 | B2 | 7/2012 | Haerle |
| 9,838,025 | B1 | 12/2017 | Deng et al. |
| 9,991,896 | B2 | 6/2018 | Katyal |
| 2007/0090864 | A1* | 4/2007 | Lee ........................ H03L 7/0802 327/157 |

* cited by examiner

*Primary Examiner* — Tomi Skibinski
(74) *Attorney, Agent, or Firm* — Kowert, Hood, Munyon, Rankin & Goetzel, P.C.

(57) ABSTRACT

An apparatus includes an oscillator circuit that may generate a clock signal with a frequency that is based on a voltage level of a control node, and a charge pump circuit that includes a first current source and a second current source. The first current source may be coupled between a first supply node and a first circuit node. The second current source may be coupled between a second supply node and a second circuit node. The charge pump circuit may be configured to pre-charge the first and second circuit nodes to voltage levels that differ from the control node and the first and second supply nodes. In addition, the charge pump circuit may select, based on phase information, either the first or second circuit node, and then modify, based on a voltage level of the selected circuit node, a voltage level of the control node.

20 Claims, 10 Drawing Sheets

ENERGY-EFFICIENT CHARGE PUMP DESIGN FOR PHASE-LOCKED LOOPS

BACKGROUND

Technical Field

Embodiments described herein are related to the field of integrated circuit implementation, and more particularly to the implementation of clock signal generation circuits.

Description of the Related Art

Systems-on-a-chip (SoCs) designs may include one or more closed-loop clock signal generators, configured to output a clock signal at a target frequency. Closed-loop clock signal generators may utilize a reference clock to generate output clock signals of a different frequency than the reference clock. In some embodiments, the target frequency may be programmable, allowing a processor in the SoC to adjust the clock frequency to a suitable value for current operating conditions, e.g., to set a low frequency value to conserve power when fewer tasks are active, or vice versa. Some examples of such closed-loop clock generators include phase-locked loops (PLLs), delay-locked loops (DLLs), and frequency-locked loops (FLLs).

Some closed-loop clock generators, such as PLLs, may utilize a charge pump circuit to increase and decrease a voltage level on a control node of a voltage-controlled oscillator (VCO) that generates the clock signal. Depending on a current frequency of the clock signal, the charge pump circuit may or may not be actively charging or discharging the control node. If the current frequency of the clock signal is too fast or too slow, then the charge pump circuit may charge or discharge the control node to increase or decrease the frequency of the clock signal generated by the VCO.

SUMMARY OF THE EMBODIMENTS

Various embodiments of a clock generation circuit are disclosed. Broadly speaking, apparatus and methods are contemplated in which an apparatus includes an oscillator circuit configured to generate a clock signal with a frequency that is based on a voltage level of a control node, and a charge pump circuit that includes a first current source and a second current source. The first current source may be coupled between a first supply node and a first circuit node. The second current source may be coupled between a second supply node and a second circuit node. The charge pump circuit may be configured to pre-charge the first and second circuit nodes to voltage levels that differ from the control node and the first and second supply nodes. The charge pump circuit may also be configured to select, based on clock signal information, either the first or second circuit node, and modify, based on a voltage level of the selected circuit node, a voltage level of the control node.

In one example, the apparatus may further comprise a phase detector circuit configured to generate the clock signal information based on a comparison of a phase of the clock signal to a phase of a reference signal. In another example, the charge pump circuit may be further configured to pre-charge the first circuit node to a voltage level that is less than a voltage level of the first supply node and higher than the voltage level of the control node. The charge pump circuit may also be configured to pre-charge the second circuit node to a voltage level that is greater than a voltage level of the second supply node and less than the voltage level of the control node.

In one embodiment of the apparatus, the charge pump circuit may further includes a first transconductance device, coupled to the first circuit node, and configured to pre-charge the first circuit node to a voltage level based on a threshold voltage of the first transconductance device. The charge pump circuit may also include a second transconductance device, coupled to the second circuit node, configured to pre-charge the second circuit node to a voltage level based on a threshold voltage of the second transconductance device.

In some examples, the charge pump circuit may further include a plurality of switches. A first switch of the plurality may be configured to couple the first transconductance device to the first circuit node. A second switch of the plurality may be configured to couple the second transconductance device to the second circuit node.

In another example, the first switch may be further configured to couple, based on the clock signal information, the first circuit node to the first transconductance device while the first circuit node is not selected. The second switch may be further configured to couple, based on the clock signal information, the second circuit node to the second transconductance device while the second circuit node is not selected.

In one embodiment, the charge pump circuit may be further configured to increase the voltage level of the control node when the first circuit node is selected. The charge pump circuit may also be configured to decrease the voltage level of the control node when the second circuit node is selected.

BRIEF DESCRIPTION OF THE DRAWINGS

The following detailed description makes reference to the accompanying drawings, which are now briefly described.

Figure 1:
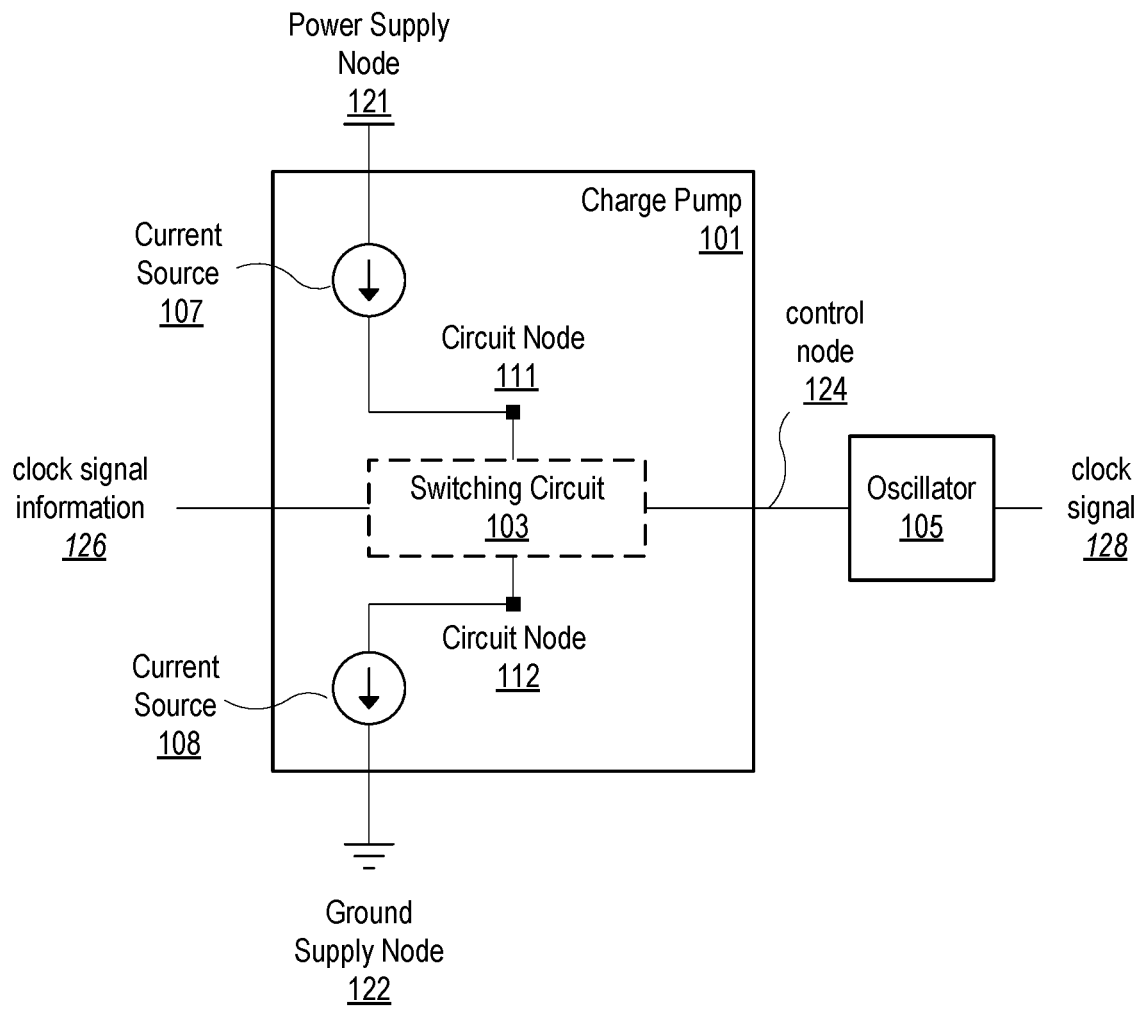
FIG. 1 illustrates a block diagram of an embodiment of a clock generation circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

Various clock signal generator designs may be utilized in a system-on-chip (SoC), such as phase-locked loops (PLLs), delay-locked loops (DLLs), frequency-locked loops (FLLs), and the like. A PLL, for example, generates a clock signal based on a reference signal. The PLL generates the clock signal by comparing a phase of the clock signal to a phase of the reference signal, and then adjusting, as needed, the frequency of the clock signal to match the reference signal. During the operation of a PLL, however, the clock signal may experience jitter, a short-term, undesired, deviation in the frequency of the clock signal. Jitter in a clock signal may limit performance of circuits that use the clock signal. For example, some circuits have minimum setup and hold times restricting when a data signal may transition relative to a transition of the clock signal. If the clock signal experiences jitter, then these setup and hold times may be lengthened to accommodate a worst-case clock transition. Lengthening setup and hold times for circuits results in lower allowable clock frequencies, thereby reducing performance.

Some PLL designs employ charge pump circuits to increase, decrease, or maintain, an amount of charge on a control node, thereby slowly changing the voltage level of the control node. The control node is coupled to a voltage-controlled oscillator (VCO), and a voltage level of the control node controls a frequency of the output clock. These charge pump circuits may increase or decrease charge on the control node by coupling the control node to a current source node or a current sink node, respectively. The current source and sink nodes are coupled to respective current source circuits, for example current mirrors, configured to source current to/from the respective node at a particular rate. When the control node is initially coupled to a selected one of the current source node or the current sink node, the selected node may be at a different voltage level than the control node, causing charge to move from the node with the higher voltage to the node with the lower voltage. This movement of charge (referred to herein as "charge sharing") may add to, or subtract from, the desired amount of charge to be sourced to or sunk from the control node, thereby resulting in the control node temporarily having an undesired voltage level, which may be transferred to the VCO. This undesired voltage level may result in jitter in the output clock signal.

In some embodiments of charge pump circuits used in PLL circuits, circuitry may be added to maintain a voltage level on the source and sink nodes that is substantially equal to the voltage level of the control node, thereby eliminating (or reducing) charge sharing on the control node when it is coupled to either the source or sink node. For example, some embodiments may employ an operational amplifier (Op Amp) circuit to maintain the voltage level on the source and sink nodes. Such circuitry, however, may consume an undesirable amount of power and/or may consume an undesired amount of die area on an integrated circuit.

An apparatus is presented for reducing a voltage differential between the control node and the source and sink nodes of a charge pump. The apparatus uses transconductance devices to pre-charge voltage levels of the source and sink nodes to levels that are closer to the voltage level of the control node than the power supply and ground supply nodes.

A block diagram of an embodiment of a clock generation circuit is illustrated in FIG. 1. As illustrated, clock generation circuit 100 includes charge pump circuit 101 coupled to oscillator circuit 105. Charge pump circuit 101 includes current sources 107 and 108, coupled, respectively, to circuit nodes 111 and 112, which, in turn, are coupled to switching circuit 103. Charge pump circuit 101 receives power from power supply node 121 and ground supply node 122. Furthermore, charge pump circuit 101 receives clock signal information 126 as an input, and generates a signal on control node 124 as an output. In turn, oscillator circuit 105 receives the signal from control node 124 as an input and generates clock signal 128 as an output. In some embodiments, clock generation circuit 100 may be part of a PLL for use in an integrated circuit, such as a system-on-chip (SoC).

It is noted, that as used herein, a "circuit node," or simply "node," refers to a point in a circuit where the terminals of two or more circuit elements meet, and may correspond to a wire, line, via, contact, blob of solder, and the like. A "signal" within a circuit refers to a transient voltage level or amount of current that may propagate via a node in response to operation of a circuit. Some signals, such as power and ground supply signals, may remain at a relatively constant voltage level during operation of a circuit, while clock and data signals may transition between two or more voltage levels frequently.

As shown, oscillator circuit 105 is configured to generate clock signal 128 with a frequency that is based on a voltage level of control node 124. For example, oscillator circuit 105 may be a voltage-controlled oscillator (VCO), with control node 124 providing the voltage level input that determines the frequency of clock signal 128. In the illustrated embodiment, an increase in the voltage level of control node 124 results in an increase in the frequency of clock signal 128, and vice versa. In other embodiments, however, the opposite may be true, such that an increase in the voltage level of oscillator circuit 105 results in a decrease in the frequency of clock signal 128.

Charge pump circuit 101, as illustrated, selectively sources or sinks current to respectively increase or decrease the voltage level of control node 124, thereby increasing or decreasing the frequency of clock signal 128. To do this, charge pump circuit 101 utilizes switching circuit 103 to pre-charge the circuit nodes 111 and 112 to voltage levels that differ from the voltage level of control node 124 and different from power supply node 121 and ground supply node 122. Based on clock signal information 126, switching circuit 103 selects either circuit node 111 or circuit node 112, which, in turn, modifies, based on a voltage level of the selected node, the voltage level of control node 124. Clock signal information 126 may, in some embodiments, include more than one signal. In various embodiments, clock signal information 126 may be indicative of a phase comparison of clock signal 128 to a reference signal (not shown) or indicative of a result of a comparison of frequencies of clock signal 128 to the reference signal. Additional details of how clock signal information 126 may be generated are disclosed below.

When circuit nodes 111 and 112 are not coupled to control node 124, they may be pulled, by current sources 107 and 108, respectively, to the voltage level of either power supply node 121 or ground supply node 122. The voltage level of control node 124 may be anywhere between the levels of power supply node 121 and ground supply node 122. When control node 124 is coupled to either circuit node 111 or circuit node 112, a difference in the voltage levels can cause charge sharing from the higher voltage level to the lower voltage level. This charge sharing may result in an unintended change in an amount of charge to be added to or subtracted from control node 124. It is noted that a capacitive element has been omitted from FIG. 1 to focus on the disclosed concepts. This capacitive element may, in some embodiments, be coupled between control node 124 and ground supply node 122.

To reduce voltage level differences between circuit nodes 111 and 112 and control node 124, charge pump circuit 101, as shown, pre-charges circuit node 111 to a voltage level that is less than a voltage level of power supply node 121 and higher than the voltage level of control node 124. In addition, charge pump circuit 101 pre-charges circuit node 112 to a voltage level that is greater than a voltage level of ground supply node 122 and less than the voltage level of control node 124. Charge pump circuit 101, therefore, increases the voltage level of control node 124 when circuit node 111 is selected, and decreases the voltage level of control node 124 when circuit node 112 is selected, resulting in a respective increase or decrease of the frequency of clock signal 128. By pre-charging circuit nodes 111 and 112 rather than letting the voltage levels of the nodes be pulled to a respective power supply node, charge pump circuit 101 may reduce a voltage difference between the selected node and control node 124. This reduction of the voltage difference may result in a reduction of voltage fluctuations on control node 124, thereby reducing unwanted fluctuations in the frequency of clock signal 128.

FIG. 1 illustrates one example of a clock generation circuit, including a general example of a charge pump circuit. Various designs for a charge pump circuit are contemplated. One embodiment of a charge pump circuit is presented in FIG. 2.

Figure 2:
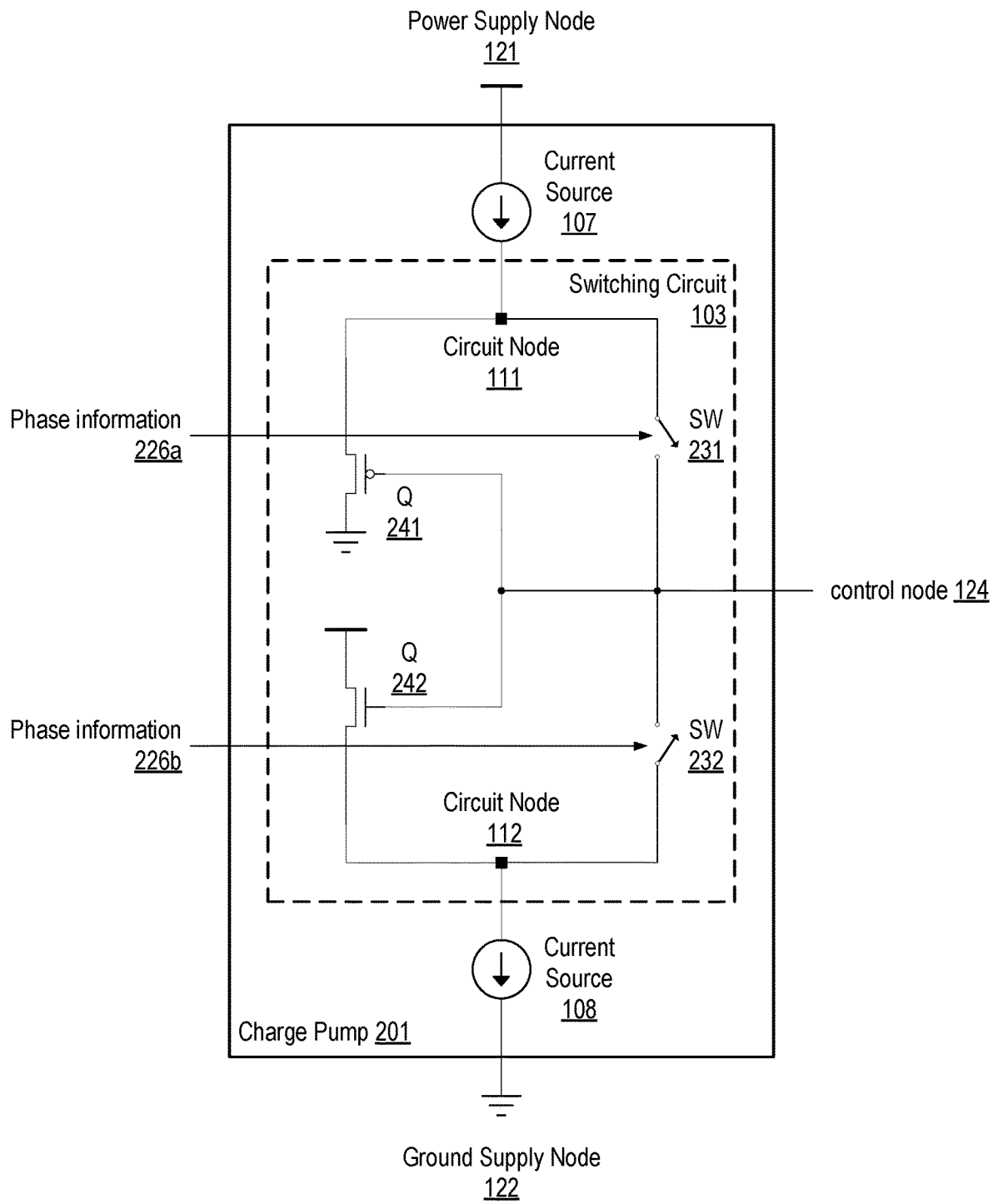
FIG. 2 shows a block diagram of an embodiment of a charge pump circuit.

Moving to FIG. 2, charge pump circuit 201 represents a possible implementation of charge pump circuit 101. Charge pump circuit 201 includes current sources 107 and 108, as shown in FIG. 1. In addition, charge pump circuit 201 further includes an embodiment of switching circuit 103 that includes switches (SW) 231 and 232, as well as transconductance devices Q241 and Q242. When charge pump circuit 201 is used in a clock generation circuit (e.g., clock generation circuit 100), control node 124 may be coupled to control node 124.

As illustrated, charge pump circuit 201 performs the functions described above for charge pump circuit 101. The additional circuit elements shown in FIG. 2 demonstrate how charge pump circuit 201 may couple circuit nodes 111 and 112 to control node 124 to adjust a voltage level, as well as how to pre-charge circuit nodes 111 and 112 when they are not coupled to control node 124. As shown in FIG. 2, clock signal information is received as two signals, phase information 226a and phase information 226b. Details of how phase information signals 226a and 226b are generated are presented below in regards to FIG. 4. Phase information signals 226a and 226b are used to control switches 231 and 232, respectively, to couple/decouple control node 124 to/from circuit nodes 111 and 112. When phase information signal 226a is asserted, switch 231 is closed, thereby coupling circuit node 111 to control node 124. An assertion of phase information signal 226b similarly closes switch 232, thereby coupling control node 124 to circuit node 112. Switches 231 and 232 may each be implemented as any suitable switching circuit, including as a single respective transconductance device such as a complementary metal-oxide-semiconductor (CMOS) transistor. De-assertion of either phase information signal 226a or 226b results in the opening of the respective switch 231 or 232, thereby de-coupling control node 124 from the corresponding one of circuit nodes 111 and 112.

As used herein, "assert" and "asserting" a signal refer to transitioning a logic signal into its active state. Some signals may be active high, meaning that the active state corresponds to a logic high voltage level. Other signals may be active low, referring to an active state that corresponds to a logic low voltage level. Accordingly, to "de-assert" and "de-asserting" a signal refer to transitioning a logic signal to its inactive state. De-asserting an active high signal, therefore, refers to transitioning the signal to a logic low level, and vice versa.

Transconductance devices Q241 and Q242 are used to pre-charge circuit nodes 111 and 112 when the circuit nodes are not coupled to control node 124. Transconductance device Q241 is coupled to circuit node 111 and is configured to pre-charge circuit node 111 to a voltage level that is based on a threshold voltage of transconductance device Q241. Similarly, transconductance device Q242 is coupled to circuit node 112 and is configured to pre-charge circuit node 112 to a voltage level based on a threshold voltage of transconductance device Q242. In addition, control node 124, as shown, is coupled to respective control terminals of transconductive devices Q241 and Q242.

Transconductance devices Q241 and Q242 may be any suitable type of device capable of adjusting an amount of conductance from an input terminal to an output terminal in response to a change in a voltage level of a control terminal. In some embodiments, transconductance devices Q241 and Q242 may each be a CMOS transistor. To pre-charge circuit nodes 111 and 112, transconductance devices Q241 and Q242 are each configured to pre-charge circuit nodes 111 and 112, respectively, based on a gate-to-source voltage (Vgs) of the respective CMOS transistor. For example, Q241 is illustrated as a p-channel CMOS transistor while Q242 is shown as an n-channel CMOS transistor. P-channel CMOS transistors turn on, or conduct, after a voltage level from the source terminal to the gate terminal reaches the threshold voltage of the transistor. Similarly, an n-channel CMOS transistor turns on after a voltage level from the gate terminal to the source terminal reaches the threshold voltage for the transistor. Control node 124 is coupled to the gate terminals of both Q241 and Q242, while circuit node 111 is coupled to the source terminal of Q241 and circuit node 112 is coupled to the source terminal of Q242. A pre-charge voltage level for each of circuit nodes 111 and 112 is, therefore, based on a voltage level of control node 124.

Accordingly, when switches 231 and 232 are open, a current path exists for current sources 107 and 108 to turn on the respective device Q241 and Q242. Circuit nodes 111 and 112 will be within a Vgs voltage level of the control node 124. When switch 231 or 232 is closed, the respective circuit node 111 or 112 will be pulled towards the voltage level of control node 124 based the amount of current sourced by the respective current source 107 or 108 and the amount of resistance through the respective switch 231 or 232. The voltage levels of nodes 111 and 112 are, therefore, pulled to a Vgs of the voltage level of control node 124.

For example, while switch 231 is open, current source 107 pulls the voltage level of circuit node 111 towards the level of power supply node 121 by adding charge to circuit node 111. As the voltage level of circuit node 111 rises, the voltage difference between circuit node 111 and control node 124, which correspond to the Vgs of Q241, increases. Since, as illustrated, Q241 is a p-channel CMOS transistor, Q241 will start to turn on after the Vgs is above the threshold voltage of Q241. While Q241 is on and conducting current, charge is removed from circuit node 111, thereby causing the voltage of circuit node 111 to cease rising. The voltage level of circuit node 111 may settle at a level based on the source-to-gate threshold voltage of Q241. When the Vgs of Q241 reaches a level that results in Q241 sinking substantially the same amount of current as is sourced by current source 107. This Vgs may be slightly higher than the threshold voltage of Q241. Circuit node 111, therefore, is pre-charged to a voltage level that is substantially the same to the voltage level of control node 124 plus the Vgs of Q241. If, however, the voltage level of control node 124 is within a Vgs of the voltage level of power supply node 121, then circuit node 111 may be pulled up to the voltage level of power supply node 121. This power supply voltage level, however, may not cause an issue since the voltage level of control node 124 is already within a Vgs of the power supply voltage level.

After circuit node 111 has been pre-charged, if switch 231 is closed due to an assertion of phase information 226a, then charge sharing may occur between circuit node 111 and control node 124, redistributing charge to eliminate the voltage level difference between the two nodes. This charge sharing may causes voltage fluctuations on control node 124 that may be received by an oscillator circuit such as oscillator circuit 105 in FIG. 1. As compared to letting the voltage level of circuit node 111 be pulled to the power supply voltage, reducing the voltage difference between circuit node 111 and control node 124 may reduce an amount of charge sharing when the nodes are coupled, thereby reducing the amount and/or severity of these voltage fluctuations.

Pre-charging of circuit node 112 works essentially the same as described for circuit node 111. While switch 232 is open, current source 108 pulls the voltage level of circuit node 112 towards the level of ground supply node 122. As the voltage level of circuit node 112 decreases, the Vgs between control node 124 and circuit node 112 increases. The n-channel Q242 will start to turn on when the Vgs reaches the threshold voltage of Q242. An equilibrium may be reached when the voltage level of circuit node 112 results in a Vgs that enables a current through Q242 that is sufficiently equal to the current sunk by current source 108. Circuit node 112, therefore, is pre-charged to a voltage level that is generally equal to the voltage level of control node 124 minus the Vgs of Q242. As described above, if the voltage level of control node 124 is within a Vgs of the level of ground supply node 122, then circuit node 112 may be pulled down to the level of ground supply node 122. Again, since the voltage level of control node 124 is already within a threshold voltage of the ground supply voltage level, this voltage level may not cause an issue.

As described for circuit node 111, if, after being pre-charged, circuit node 112 is coupled to control node 124, then charge is redistributed between the two nodes, resulting in voltage fluctuations on control node 124 that may propagate to an oscillator circuit, causing jitter on a clock signal generated by the oscillator circuit. Reducing a voltage difference between control node 124 and circuit node 112 reduces an amount of charge to redistribute between the nodes. The reduced charge redistribution results in less fluctuation to the voltage level of control node 124, and, therefore, less jitter in the clock signal.

A voltage level to which circuit nodes 111 and 112 are charged may change based on the voltage level on control node 124. For example, if both switches 231 and 232 are open, Q241 and Q242 may cause circuit nodes 111 and 112 to be pre-charged to respective voltage levels based on the corresponding threshold voltages of the CMOS transistors and on the voltage level of control node 124. If switch 231 is closed, current source 107 supplies charge to control node 124 and the voltage level of control node 124 rises as a result. Increases to the voltage level of control node 124 cause an increase to the gate-to-source voltage level on Q242, causing the voltage level of circuit node 112 to rise until an equilibrium is again reached when the voltage level of circuit node 112 is generally a threshold voltage level less than the new voltage level of control node 124.

A voltage level of circuit node 111 may similarly decrease in response to a closure of switch 232 (while switch 231 is open). Current source 108 discharges control node 124, thereby reducing the voltage level on control node 124. The lower voltage on the gate of Q241 causes an increase in current through Q241, thereby removing more charge from circuit node 111. The loss of charge causes the voltage level of circuit node 111 to fall until an equilibrium is again reached when the voltage level of circuit node 111 is generally a threshold voltage level greater than the new voltage level of control node 124.

The embodiment of FIG. 2 illustrates one example of a charge pump circuit that may be utilized in the clock generation circuit of FIG. 1. A different embodiment of a charge pump circuit is presented in FIG. 3. Charge pump circuit 301 represents another possible implementation of charge pump circuit 101. Charge pump circuit 301 includes the same elements as charge pump circuit 201, including current sources 107 and 108, switches (SW) 231 and 232, transconductance devices Q241 and Q242. Additional elements included in charge pump circuit 301 are switches (SW) 333 and 334 as well as inverting circuits (INV) 304 and 306. Charge pump circuit 301 functions as described above for charge pump circuit 201, with exceptions as noted below.

Referring back to FIGS. 2, Q241 and Q242 are directly coupled to circuit nodes 111 and 112, respectively. When, for example, switch 231 is closed, Q241 continues to discharge circuit node 111 while current source 107 is trying to charge circuit node 111, thereby slowing the addition of charge to control node 124. As charge redistribution occurs between circuit node 111 and control node 124, the voltage levels of circuit node 111 and control node 124 converge to the same voltage level. The reduction of the source-to-gate voltage of Q241 causes Q241 to turn off quickly and allows current source 107 to more effectively charge control node 124. The addition of switches 333 and 334 may enable charge pump 301 to charge node 124 more quickly than charge pump 201 in FIG. 2.

As illustrated, switch 333 is configured to couple transconductance device Q241 to circuit node 111, and switch 334 is configured to couple transconductance device Q242 to circuit node 112. Based on a complement of phase information 226a, switch 333 couples circuit node 111 to Q241 while circuit node 111 is not coupled to control node 124. Similarly switch 334 couples, based on a complement of phase information 226b, circuit node 112 to Q242 while circuit node 112 is not coupled to control node 124.

It is noted that, similar to switches 231 and 232, switches 333 and 334 may each be implemented as any suitable switching circuit, including as a single respective transconductance device such as a CMOS transistor. In addition, inverting circuits INV 304 and INV 306 may be implemented as any suitable type of inverting circuits capable of generating an output signal that is complementary to an input signal.

The addition of switch 333 and INV 304 results in circuit node 111 being coupled to Q241, and decoupled from control node 124, when phase information 226a is de-asserted. When phase information 226a is asserted, the opposite is true, circuit node 111 is de-coupled from Q241 and coupled to control node 124. Circuit node 112 is configured similarly, coupled to Q242 when phase information 226b is de-asserted and coupled to control node 124 when phase information 226b is asserted.

By decoupling the respective transconductance device from a selected circuit when the selected circuit node is coupled to the control node, control node 124 may be charged to a desired voltage level more quickly than when the transconductance device remains coupled to the selected circuit node. Charging control node 124 to the desired voltage level faster may result in a reduction of frequency fluctuations on a generated clock signal that is dependent on the voltage level of control node 124. It is noted that the designs of FIGS. 2 and 3 may enable a lower power and smaller die area solution that an embodiment that utilizes a more complex circuit such as an Op Amp. The embodiment of charge pump 201 merely uses two additional transconductive devices. The embodiment of charge pump 301 adds the same two transconductive devices as well as two switches and two inverter circuits. Both charge pumps 201 and 301 reuse current sources 107 and 108, rather than adding additional circuitry, such as Op Amp or biasing circuits, to precharge circuit nodes 111 and 112. Embodiments such as charge pumps 201 and 301 may, therefore, provide a smaller and more power efficient solution than an Op Amp design.

Figure 3:
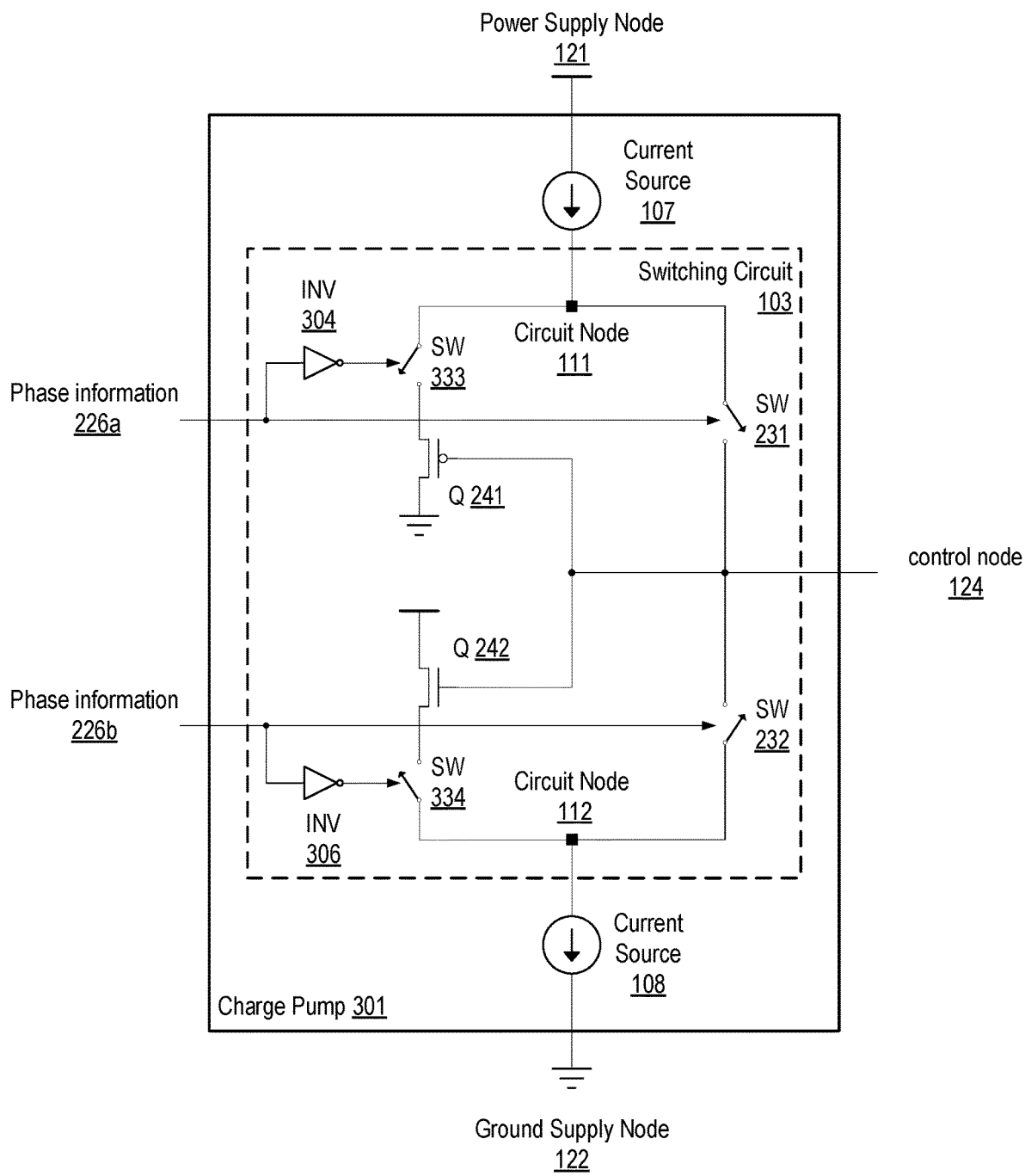
FIG. 3 depicts a block diagram of a different embodiment of a charge pump circuit.
Figure 4:
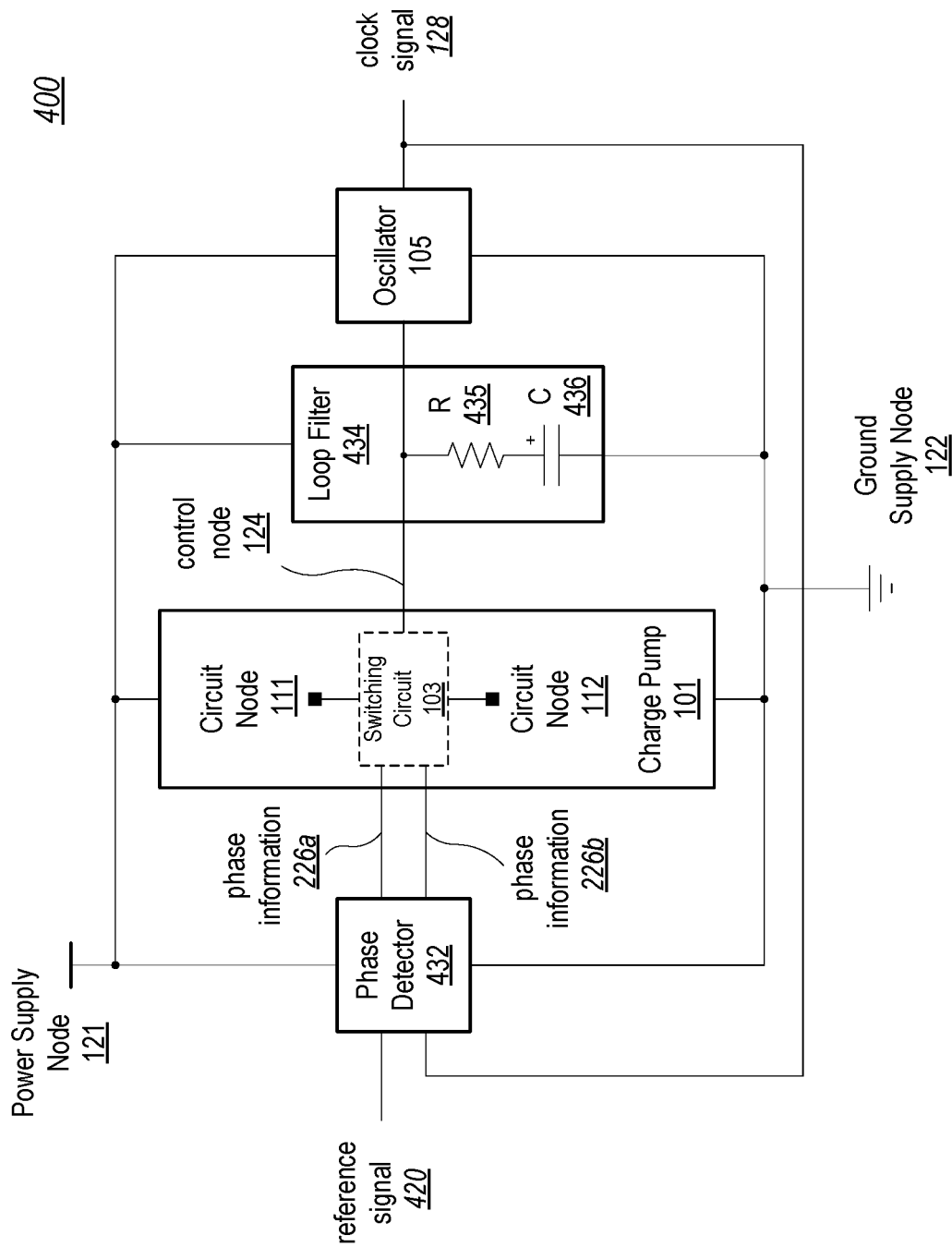
FIG. 4 illustrates a block diagram of a different embodiment of a clock generation circuit.

FIGS. 2-3 describe various embodiments of charge pump circuits that may be used in a clock generation circuit. FIG. 4 illustrates an embodiment of a clock generator circuit that implements a charge pump circuit such as charge pump circuits 201 and 301. As shown, clock generator circuit 400 includes charge pump circuit 101, phase detector circuit 432, loop filter 434, and oscillator circuit 105. Clock generator circuit 400 receives power from power supply node 121 and ground supply node 122, and receives reference signal 420 as an input signal. Clock signal 128 is generated as an output. In some embodiments, charge pump circuit 101 may correspond to either of charge pump circuits 201 and 301. As illustrated, charge pump circuit 101 may perform as described for charge pump circuit 301, except as noted below. Similarly, oscillator circuit 105 corresponds to oscillator circuit 105 in FIG. 1, except as noted below.

When clock generator circuit 400 is enabled, oscillator circuit 105 generates clock signal 128, whose frequency is based on a voltage level of control node 124. As shown, phase detector circuit 432 receives clock signal 128 as well as reference signal 420. In some embodiments, an additional frequency divider circuit (not shown) may be included to reduce a frequency of clock signal 128 before it is received by phase detector circuit 432 such that a frequency of the divided clock signal and a frequency of the reference signal are similar. A frequency divider may be used to increase a frequency of clock signal 128 relative to the frequency of reference signal 420. Phase detector circuit 432 generates phase information 226a and 226b based on timing of transitions on reference signal 420 and clock signal 128. For example, if transitions of reference signal 420 occur ahead of transitions of clock signal 128, then phase detector circuit 432 may assert phase information 226a to cause charge pump circuit 101 to charge control node 124. The charging of control node 124 causes capacitor 436 to store charge and increase the voltage level of control node 124. This increase to the voltage level of control node 124 causes oscillator circuit 105 to increase the frequency of clock signal 128. The increased frequency of clock signal 128 may result in transitions of clock signal 128 occur at a same time or ahead of corresponding transitions of reference signal 420.

If clock signal 128 transitions ahead of reference signal 420, then phase detector circuit 432 may de-assert phase information 226a, and assert phase information 226b. The assertion of phase information 226b has an opposite effect as the assertion of phase information 226a, causing charge pump circuit 101 to discharge control node 124, lowering the voltage level on loop filter 434 and causing oscillator circuit 105 to reduce the frequency of clock signal 128. It is noted that in the illustrated embodiment, oscillator circuit 105 is described as increasing the frequency of clock signal 128 when the voltage level of control node 124 increases, and vice versa. In other embodiments, oscillator circuit 105 may reduce the frequency of clock signal 128 in response to an increase in the voltage level of control node 124, and increase the frequency in response to a corresponding decrease in the voltage level of control node 124.

Phase detector circuit 432 may continuously compare the transitions of reference signal 420 and clock signal 128, asserting and de-asserting phase information 226a and 226b such that the transitions occur at substantially the same time. When the transitions of clock signal 128 occur within a predetermined amount of time of the transitions of reference signal 420, then clock generator circuit 400 may be in a "lock" condition or a "locked" state. In the locked state, the frequency of clock signal 128 is within an acceptable range of a desired or target frequency.

Clock jitter or other frequency deviations that may be caused when control node 124 is coupled to circuit node 111 or circuit node 112, may cause a loss of lock if the frequency deviations exceed the acceptable range. Even if clock generator circuit 400 remains in a locked state, clock jitter may cause unwanted behavior or reduced performance of circuits that receive clock signal 128.

As illustrated, loop filter 434 may help to attenuate voltage glitches propagating to the input of oscillator circuit 105. Loop filter 434 may correspond to a low-pass filter, allowing low frequency voltage changes on control node 124 to adjust the frequency of clock signal 128 while resisting high frequency changes such as voltage glitches that may result from the operation of charge pump 101 as well as glitches and other signal noise generated by other circuits. Loop filter 434 is shown with resistor 435 and capacitor 436. Other embodiments may include additional circuit elements as well as different circuit configurations. The impedance included in loop filter 434 may contribute to an overall load coupled to control node 124.

FIG. 4 describes an embodiment of a clock generation circuit that may include a charge pump circuit such as charge pump circuits 201 and 301 illustrated in FIGS. 2 and 3, respectively. Moving to FIGS. 5A and 5B, two charts are shown that depict waveforms that may be associated with clock generator circuit 400, and, more specifically, charge pump circuits such as charge pump circuit 301. Both chart 500 in FIG. 5A and chart 510 in FIG. 5B include five waveforms associated with charge pump circuit 301. Phase information 226a and 226b depicts possible waveforms representing the phase information input to charge pump circuit 301. Circuit node 111 and circuit node 112 depict waveforms that may occur at circuit nodes 111 and 112, respectively. Similarly, control node 124 corresponds to a possible waveform occurring on control node 124. Dashed lines labeled Vpower indicate a voltage level of power supply node 121.

Figure 5A:
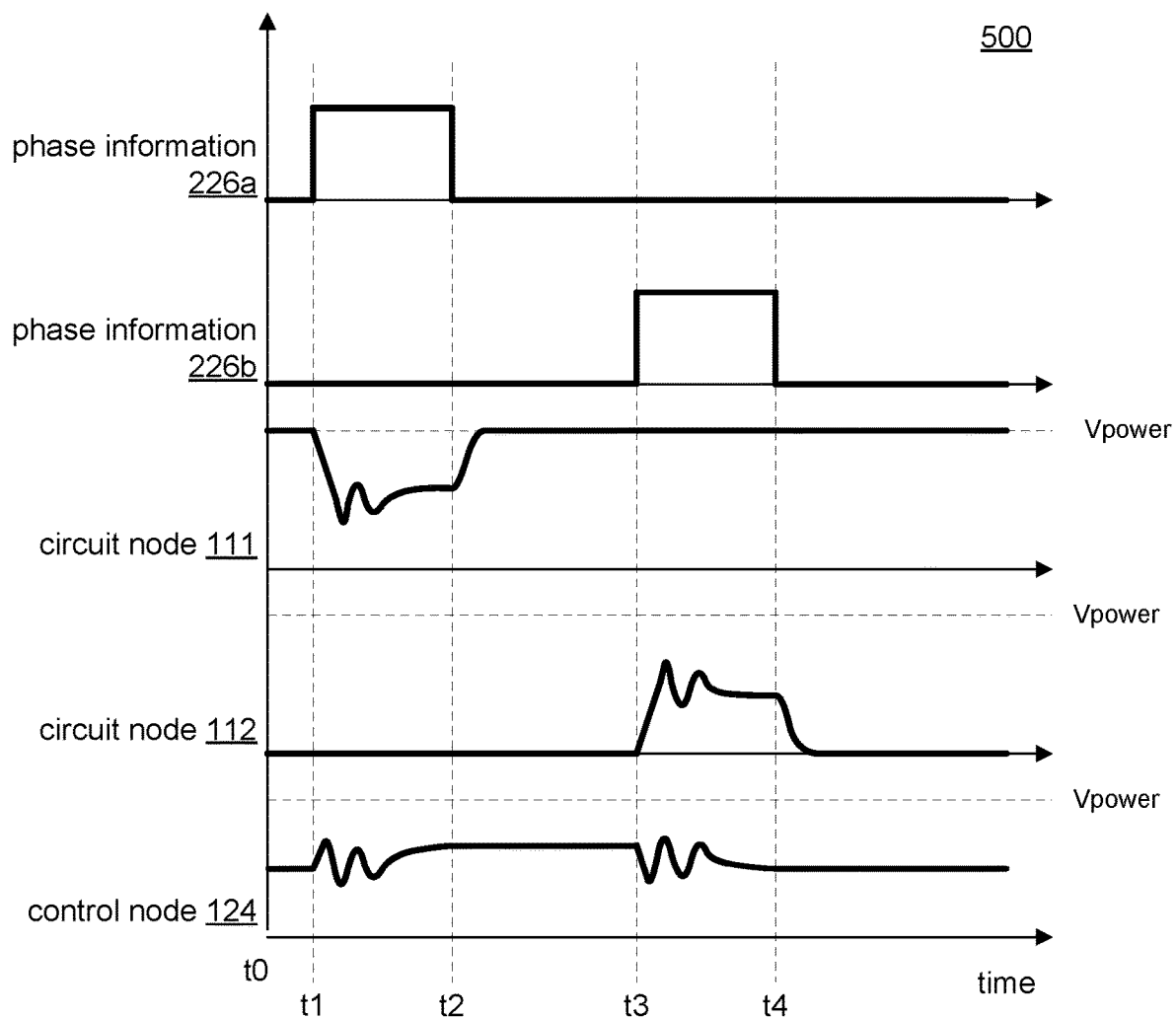
FIGS. 5A and 5B each show a chart depicting an example of waveforms that may be associated with respective charge pump circuits.

The waveforms of FIG. 5A demonstrate how signals propagating through charge pump circuit 301 may appear if transconductance devices Q241 and Q242 are removed. At time t0, phase information 226a and 226b are both low, causing switches 231 and 232 to be open. Without transconductance devices Q241 and Q242 to pre-charge circuit nodes 111 and 112 to different voltage levels, current source 107 pulls circuit node 111 up to the voltage level of power supply node 121 while current source 108 pulls circuit node 112 down to the voltage level of ground supply node 122. Control node 124, as shown, is at a voltage level that is between the voltage levels of power supply node 121 and ground supply node 122.

At time t1, phase information 226a is asserted, causing switch 231 to close, coupling circuit node 111 to control node 124. As shown, a large voltage difference between circuit node 111 and control node 124 results in charge sharing between the two nodes and a sudden drop in the voltage level of circuit node 111 as the voltage level falls to match the voltage level of control node 124. Due to a large amount of charge sharing, voltage glitches occur on both circuit node 111 and control node 124. These voltage glitches may propagate to a voltage-controlled oscillator such as oscillator circuit 105 in FIG. 4 and cause frequency jitter in clock signal 128. After the ringing settles, the voltage level of control node 124 ramps up until time t2. At time t2, phase information 226a de-asserts, switch 231 is opened, and the voltage level of circuit node 111 is pulled back up to the level of power supply node 121. The voltage level of control node 124 may be higher than before phase information 226a was asserted at time t1.

At time t3, phase information 226b is asserted, causing switch 232 to close, coupling circuit node 112 to control node 124. Again, the voltage difference between circuit node 112 and control node 124 causes a large amount of charge to be redistributed between the two nodes and a sudden increase in the voltage level of circuit node 112 to match the voltage level of control node 124. Voltage glitches may again occur, potentially causing frequency jitter on clock signal 128 in FIG. 1. After the ringing settles, the voltage level of control node 124 ramps down until time t4. Phase information 226b is de-asserted at time t4, causing switch 232 to open, and circuit node 112 may again be pulled down to the level of ground supply node 122 by current source 108. The voltage level of control node 124 is lower than it was before phase information 226b is asserted at time t3.

It is noted that an amount of capacitance on control node 124, such as included in loop filter 434 in FIG. 4, may be much higher than an amount of capacitance on either circuit nodes 111 or 112. This higher capacitance on control node 124 may prevent the voltage level of control node 124 from changing as much as the voltage levels of circuit nodes 111 and 112 when switch 231 or 232 is closed.

Figure 5B:
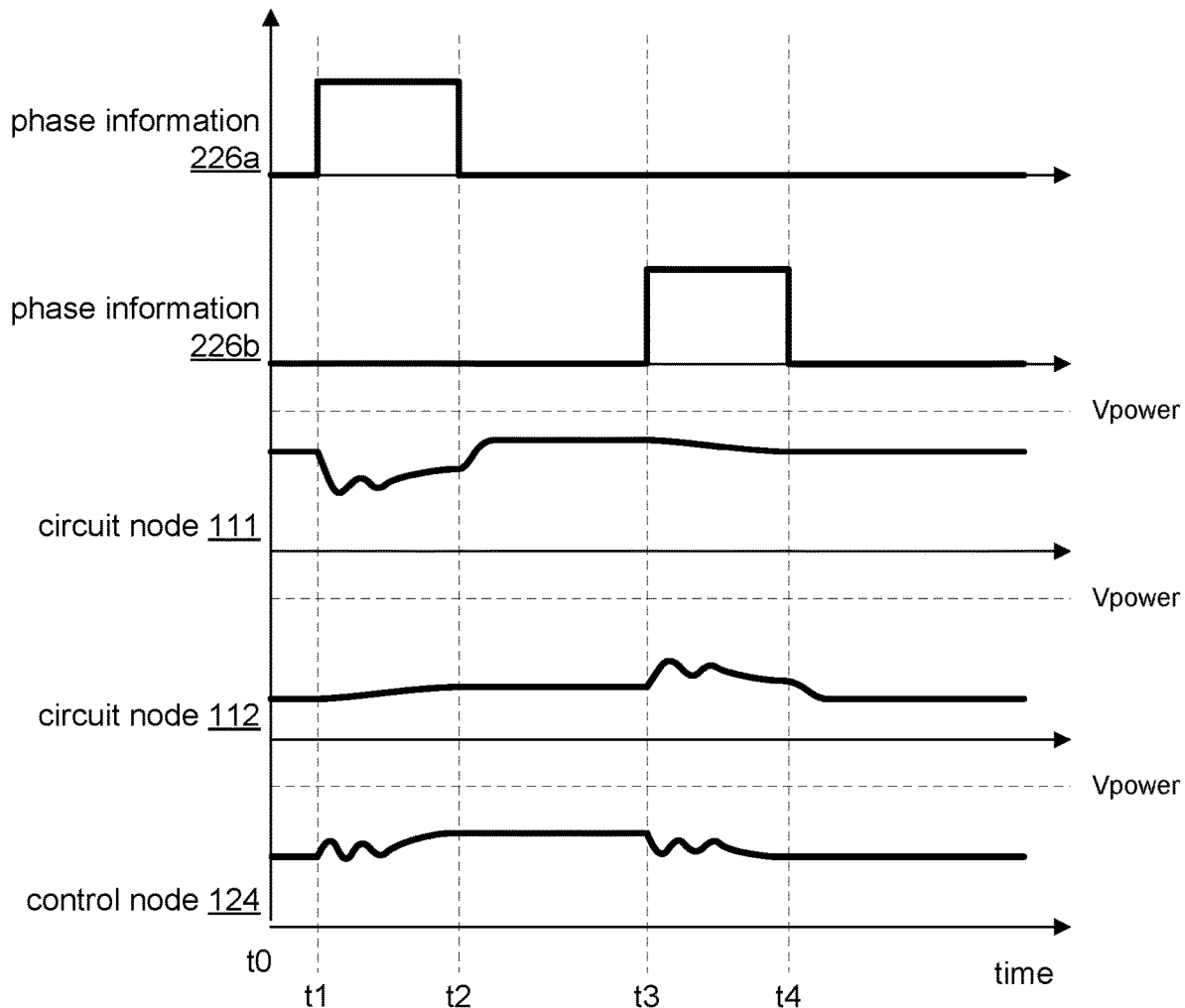

The waveforms of FIG. 5B demonstrate how signals propagating through charge pump circuit 301 may appear when transconductance devices Q241 and Q242 are used to pre-charge circuit nodes 111 and 112. At time t0, phase information 226a and 226b are both low, causing switches 231 and 232 to be open, while causing switches 333 and 334 to be closed. Transconductance devices Q241 and Q242 are coupled to circuit nodes 111 and 112, respectively. A voltage level of control node 124 enables transconductance devices Q241 and Q242 to pre-charge circuit nodes 111 and 112 to respective voltage levels. Q241 may pre-charge circuit node 111 to a voltage level substantially equal to the voltage level of control node 124 plus a Vgs of Q241. Similarly, Q242 may pre-charge circuit node 112 to a voltage level that is substantially equal to the voltage level of control node 124 minus a Vgs of Q242. Control node 124, as shown, is again at a voltage level that is between the voltage levels of power supply node 121 and ground supply node 122.

At time t1, phase information 226a is asserted, causing switch 231 to close and switch 333 to open, de-coupling circuit node 111 from Q241 and coupling it to control node 124 instead. A voltage difference between circuit node 111 and control node 124 corresponds to the threshold voltage of Q241. This voltage difference results in charge sharing between the two nodes and a sudden drop in the voltage level of circuit node 111 as the voltage level falls to match the voltage level of control node 124.

It is noted that the amount of charge that is shared may be less than at time t1 of FIG. 5A. Voltage glitches may still occur on both circuit node 111 and control node 124. These voltage glitches, however, may be smaller than those shown in FIG. 5A, and may also occur over a shorter duration. In some embodiments, these smaller glitches may propagate to a voltage-controlled oscillator such as oscillator circuit 105 in FIG. 4 and cause frequency jitter in clock signal 128. In other embodiments, however, the smaller glitches may be filtered out, for example, by the capacitance in loop filter 434, or at least attenuated to a point at which the resulting jitter in clock signal 128 is negligible or within an acceptable frequency range.

After the ringing settles, the voltage level of control node 124 ramps up until time t2. At time t2, phase information 226a de-asserts, switch 231 is opened, switch 333 is closed, and the voltage level of circuit node 111 is again pre-charged by Q241 based on the new voltage level of control node 124 and the threshold voltage of Q241. As described above for FIG. 5A, the voltage level of control node 124 may be higher than before phase information 226a was asserted.

At time t3, phase information 226b is asserted, causing switch 232 to close and switch 334 to open, de-coupling circuit node 112 from Q242 and instead coupling circuit node 112 to control node 124. A voltage difference between circuit node 112 and control node 124 may correspond to the threshold voltage of Q334, and causes an amount of charge to be shared between the two nodes and a sudden increase in the voltage level of circuit node 112 to match the voltage level of control node 124. It is noted that the amount of charge that is redistributed may be less than at time t3 of FIG. 5A.

Voltage glitches may again occur, but may be less severe and last for a shorter amount of time than the glitches shown at time t3 in FIG. 5A. In some cases, these lower voltage and shorter lasting voltage glitches may be filtered out completely, for example, by loop filter 434. The voltage glitches may again cause frequency jitter on clock signal 128. As described in regard to time t1 in FIG. 5B, the amount of frequency jitter may remain small enough to be negligible or within an acceptable tolerance. After the ringing settles, the voltage level of control node 124 ramps down until time t4. At time t4, phase information 226b is de-asserted, causing switch 232 to open, and switch 334 to close. Circuit node 112 may again be pre-charged based on the new voltage level of control node 124 and the threshold voltage of Q242. The voltage level of control node 124 may be lower than it was before phase information 226b is asserted.

As demonstrated by FIG. 5B, pre-charging circuit nodes 111 and 112 may reduce a voltage level difference from circuit node 111 or 112 to control node 124. When one of circuit nodes 111 and 112 is selected to be coupled to control node 124, the reduced voltage difference may reduce an amount of charge redistribution occurring after the coupling. Reducing the amount of charge redistribution between the selected circuit node and control node 124 may reduce voltage glitches on control node 124, thereby reducing clock jitter and other undesirable frequency deviations on an output clock signal, such as clock signal 128.

It is noted that the waveforms depicted in FIGS. 5A and 5B are merely examples. These waveforms have been simplified for clarity to highlight the disclosed features. In some embodiments, for example, assertions of phase information 226a and 226b may overlap during operation of a clock generator circuit. In addition, the relative timescales and voltage levels may differ in some embodiments. For example, ringing oscillations shown in the waveforms may have different durations and different voltage levels.

FIGS. 1-5 above describe circuits and waveforms associated with embodiments of clock generation circuits. Various procedures and methods may be utilized in the operation of such circuits. Moving to FIG. 6, a flow diagram of an embodiment of a method for operating a clock generation circuit is illustrated. Method 600 may be applied to clock generation circuits such as clock generation circuits 100 and 400 in FIGS. 1 and 4. Referring collectively to clock generation circuit 400 and method 600 in FIG. 6, the method begins in block 601.

A charge pump circuit charges a first circuit node to a first voltage level that is less than a voltage level of a power supply node of a clock generation circuit (block 602). As illustrated, charge pump circuit 101 charges circuit node 111 to a voltage level that is less than a voltage level of power supply node 121 and higher than a voltage level of control node 124. In some embodiments, a transconductance device such as Q241 in FIGS. 2 and 3 may be coupled to circuit node 111 to pre-charge circuit node 111 to a voltage level that is higher than the voltage level of control node 124 by a threshold voltage of Q241.

The charge pump circuit charges a second circuit node to a second voltage level that is less than the first voltage level and greater than a voltage level of a ground supply node (block 604). Charge pump circuit 101, as shown, charges circuit node 112 to a voltage level that is greater than voltage level of ground supply node 122 and less than a voltage level of control node 124. Transconductance device Q242, in some embodiments, may be used to pre-charge circuit node 112 to a voltage level that is lower than the voltage level of control node 124 by a threshold voltage of Q242.

A phase detection circuit generates phase information based on a comparison of a clock signal and a reference signal (block 606). As illustrated, phase detector circuit 432 receives reference signal 420 and clock signal 128. Based on a difference in phase between transitions of reference signal 420 and clock signal 128, phase detector generates phase information, including the signals, phase information 226a and 226b. Phase information 226a may be asserted and phase information 226b may be de-asserted when clock signal 128 lags behind reference signal 420 (e.g., transitions of reference signal 420 occur before corresponding transitions of clock signal 128). Similarly, phase information 226b may be asserted and phase information 226a de-asserted when clock signal 128 leads (e.g., transitions before) reference signal 420.

Based on the phase information, the charge pump circuit selects at least one of the first and second circuit nodes (block 608). Charge pump circuit 101 receives phase information 226a and 226b. As shown in FIG. 3, an assertion of phase information 226 causes switch 231 to close and switch 333 to open, thereby selecting circuit node 111 to modify a voltage level of control node 124. An assertion of phase information 226b, in contrast, causes switch 232 to close and switch 334 to open, thereby selecting circuit node 112 to modify the voltage level of control node 124.

The charge pump circuit adjusts a voltage level of a control signal based on a voltage level of the selected circuit node (block 610). Charge pump circuit 101 couples the selected one of circuit node 111 or circuit node 112 to control node 124. If circuit node 111 is selected, then current source 107 charges control node 124, causing charge to flow to capacitor C436, resulting in an increase to the voltage level of control node 124. Otherwise, if circuit node 112 is selected, then current source 108 discharges control node 124, causing charge to flow from capacitor C436, resulting in a decrease to the voltage level of control node 124. It is noted that the pre-charged voltage levels of circuit nodes 111 and 112 are either a threshold voltage above (circuit node 111) or below (circuit node 112) the voltage level of control node 124. By keeping the voltages of circuit nodes 111 and 112 within a threshold voltage of the level of control node 124, a voltage difference between control node 124 and the selected circuit node may be reduced to a level that reduces voltage glitches when switch 231 or 232 is closed.

An oscillator circuit generates a frequency of a clock signal based on the voltage level of the control signal (block 612). As illustrated, an input terminal for oscillator circuit 105 is coupled to control node 124. A frequency of clock signal 128 is based on a voltage level at this input terminal, and therefore is based on the voltage level of control node 124. In the illustrated embodiment, an increase in the voltage level of control node 124 results in an increased frequency of clock signal 128, and a decrease in the voltage level results in a decrease in the frequency. In other embodiments, however, the opposite may be true. The method ends in block 614.

Figure 6:
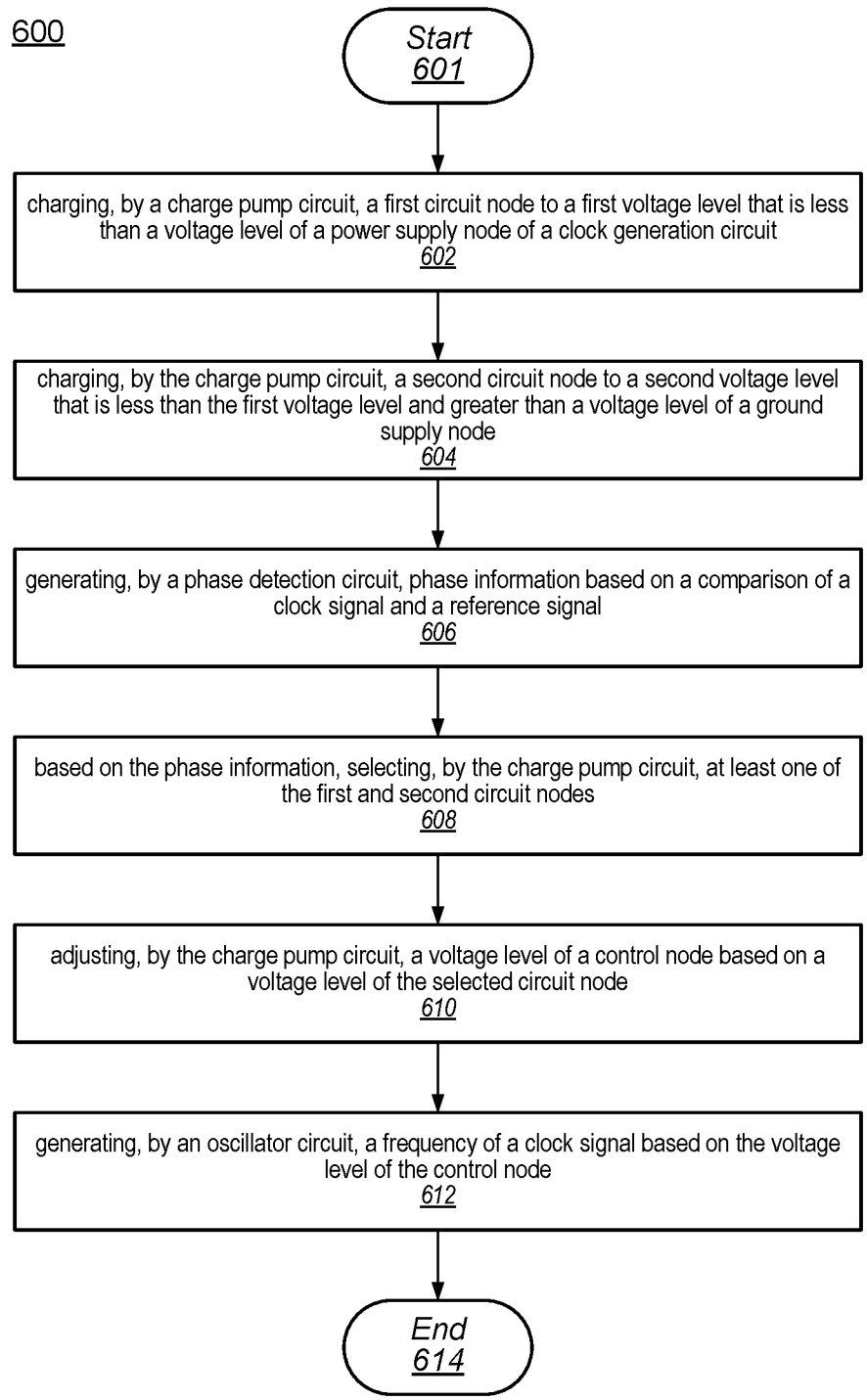
FIG. 6 depicts a flow diagram of an embodiment of a method for operating a clock generation circuit.
Figure 7:
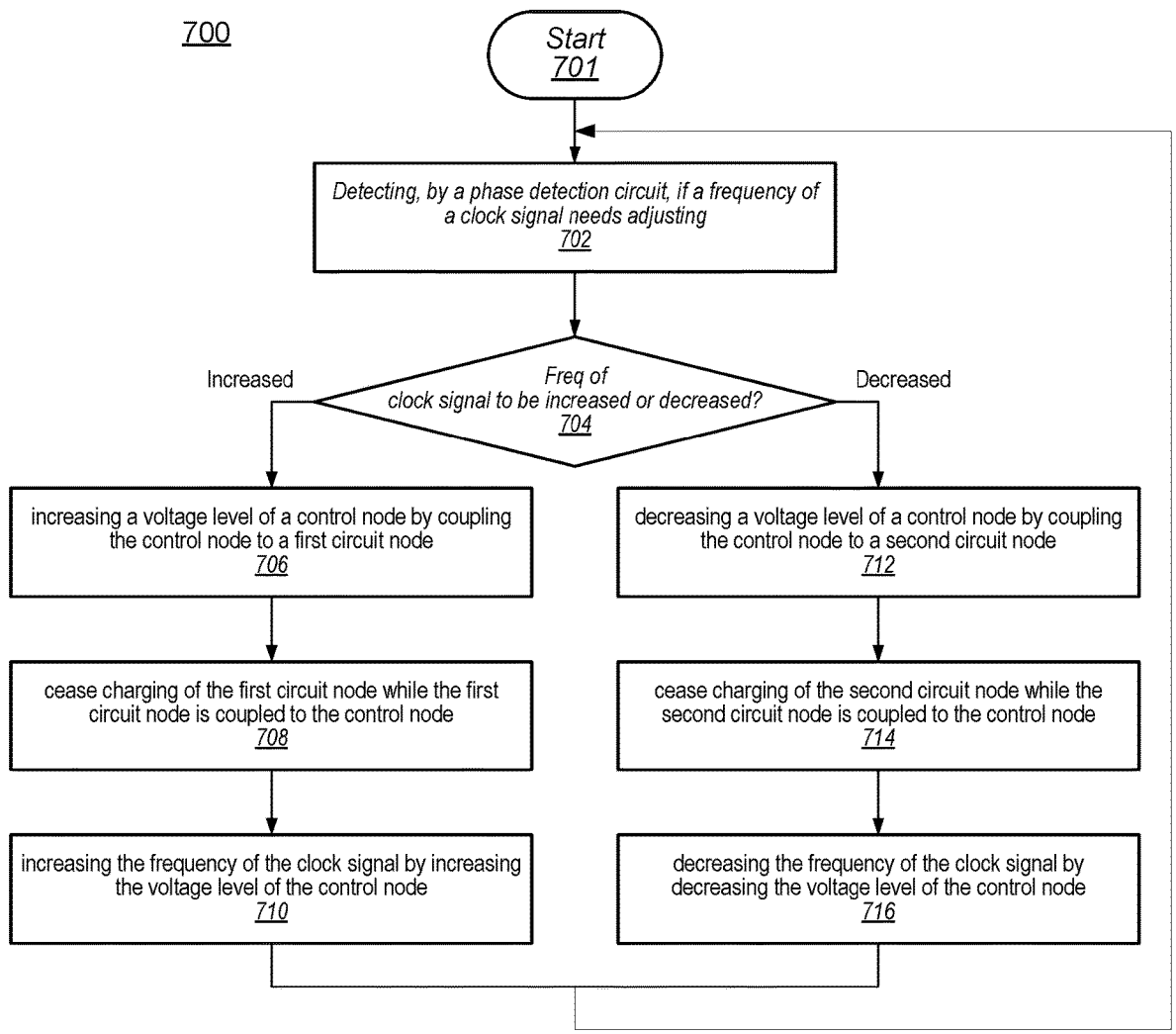
FIG. 7 shows a flow diagram of a different embodiment of a method for operating a clock generation circuit.

It is noted that the method illustrated in FIG. 6 is merely an example to demonstrate operation of the disclosed clock generation circuits. Other methods may be utilized with the disclosed circuits. A different example of a method for operating a clock generation circuit is shown in FIG. 7. Turning to FIG. 7, a flow diagram of this different method for operating a clock generation circuit is illustrated. Method 700 may, accordingly, be applied to clock generation circuits such as clock generation circuits 100 and 400 in FIGS. 1 and 4. Referring collectively to charge pump circuit 301, clock generation circuit 400, and the flowchart of FIG. 7, the method begins in block 701.

A phase detection circuit detects if a frequency of a clock signal needs adjusting (block 702). As illustrated, phase detector circuit 432, based on a comparison of reference signal 420 and clock signal 128, determines if a frequency of clock signal 128 should be adjusted. Phase detector circuit 432 may determine if transitions of clock signal 128 occur before or after corresponding transitions of reference signal 420. At this time, switches 231 and 232 may be open and switches 333 and 334 may be closed, allowing transconductance devices Q241 and Q242 to pre-charge circuit nodes 111 and 112, respectively.

Further operations of method 700 may depend on a frequency of the clock signal (704). Phase detector circuit 432 generates phase information based on the comparison of reference signal 420 and clock signal 128. If clock signal 128 lags behind reference signal 420, then the frequency of clock signal 128 may need to be increased. In response to a determination that the frequency needs to be increased, phase detector circuit 432 asserts phase information 226a and method 700 moves to block 706 to charge control node 124. If, however, clock signal 128 leads ahead of reference signal 420, then the frequency of clock signal 128 may need to be decreased. In response to a determination that the frequency needs to be decreased, phase detector circuit 432 asserts phase information 226b and method 700 moves to block 712 to discharge control node 124.

If phase information indicates the frequency of the clock signal is slow, then a charge pump circuit increases a voltage level of a control node by coupling the control node to a first circuit node (block 706). If phase detector circuit 432 asserts phase information 226a as an indication that clock signal 128 is lagging reference signal 420, then, referring to FIG. 3, switch 231 is closed, thereby coupling circuit node 111 to control node 124 and creating a circuit path for current source 107 to charge control node 124.

The charge pump circuit ceases charging of the first circuit node while the first circuit node is coupled to the control node (block 708). As illustrated, in response to the assertion of phase information 226a, inverter circuit 304 de-asserts a complement of phase information 226a. This de-assertion of the complement of phase information 226a causes switch 333 to open, thereby de-coupling transconductance device Q241 from circuit node 111. As described above, Q241 is coupled to circuit node 111 while switch 231 is open, allowing Q241 to pre-charge circuit node 111 to a voltage level that is less than power supply node 121 and greater than the voltage level of control node 124. When switch 231 is closed, however, Q241 is decoupled from circuit node 111 to allow charge from current source 107 to flow to control node 124 rather than through Q241 to ground supply node 122. By decoupling Q241 from circuit node 111, the voltage level of control node 124 may be increased faster.

An oscillator circuit increases the frequency of the clock signal by increasing the voltage level of the control node (block 710). An input node on oscillator circuit 105 is coupled to control node 124. As the voltage level of control node 124 is increased by current source 107, oscillator circuit 105 generates clock signal 128 with an increasing frequency. The method returns to block 702 to determine if the frequency of the clock signal needs further adjusting.

If phase information indicates the frequency of the clock signal is fast, then the charge pump circuit decreases a voltage level of a control node by coupling the control node to a second circuit node (block 712). Phase detector circuit 432 asserts phase information 226b as an indication that clock signal 128 is leading reference signal 420, and therefore the frequency of clock signal 128 should be reduced. In response to the assertion of phase information 226b, switch 231 is closed, thereby coupling circuit node 112 to control node 124 and creating a circuit path for current source 108 to discharge control node 124.

The charge pump circuit ceases charging of the second circuit node while the second circuit node is coupled to the control node (block 714). As shown, inverter circuit 306 de-asserts a complement of phase information 226b in response to the assertion of phase information 226b. This de-assertion of the complement of phase information 226b causes switch 334 to open, thereby de-coupling transconductance device Q242 from circuit node 112. When switch 232 closes, switch 334 opens, decoupling Q242 from circuit node 112 to allow current source 108 to discharge control node 124 rather than drawing current through Q242 from power supply node 121. By decoupling Q242 from circuit node 112, the voltage level of control node 124 may be decreased faster.

An oscillator circuit decreases the frequency of the clock signal by decreasing the voltage level of the control node (block 716). Decreases to the voltage level of control node 124 cause oscillator circuit 105 to generate clock signal 128 with a decreasing frequency. The method returns to block 702 to determine if the frequency of the clock signal needs further adjusting.

It is noted that method 700 of FIG. 7 is one example for demonstrating the disclosed subject matter. In some embodiments, operations from method 700 may be combined with operations described for method 600 in FIG. 6. For example, although not shown in method 700 for brevity, operations such as 602 and 604 for charging the circuit nodes may be performed in conjunction with method 700.

The figures and descriptions disclosed above have been directed to the design and operation of clock generation circuits. Clock generation circuits may be employed by a variety of computer systems, such as a desktop computer, laptop computer, smartphone, tablet, wearable device, and the like. In some embodiments, the circuits described above may be implemented on a system-on-chip (SoC) or other type of integrated circuit.

Figure 8:
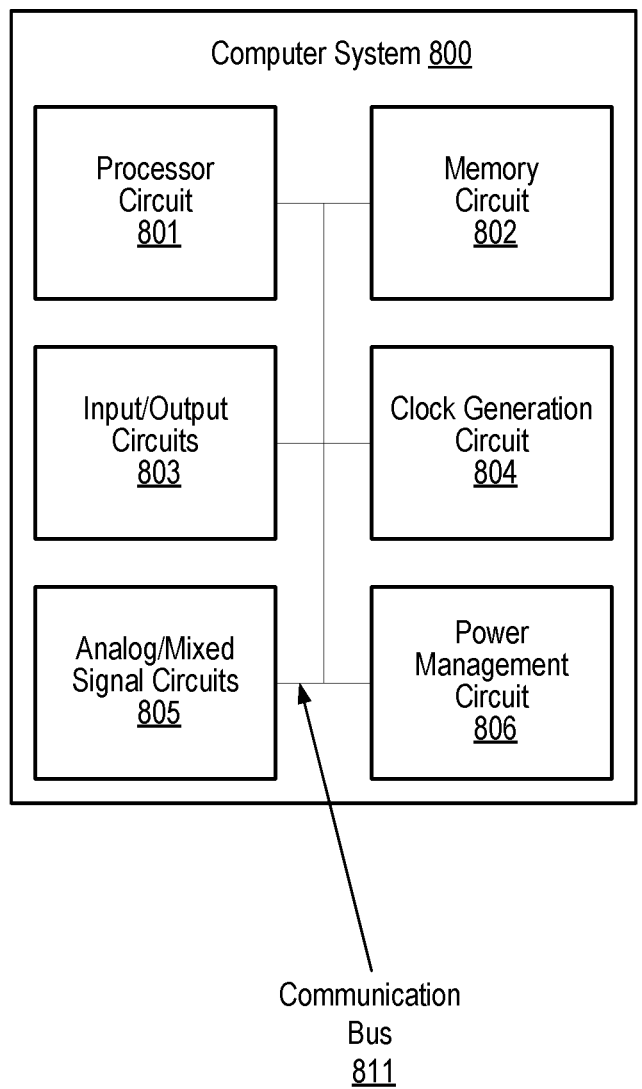
FIG. 8 shows a block diagram of an embodiment of a system-on-chip (SoC).

Proceeding to FIG. 8, a block diagram depicting an embodiment of computer system 800 that includes the disclosed circuits is shown. In some embodiments, computer system 800 may provide an example of an integrated circuit that includes a clock generation circuit such as illustrated in FIGS. 1 and 4. As shown, computer system 800 includes processor circuit 801, memory circuit 802, input/output circuits 803, clock generation circuit 804, analog/mixed-signal circuits 805, and power management circuit 806. These functional circuits are coupled to each other by communication bus 811.

Processor circuit 801, in various embodiments, may be representative of a general-purpose processor that performs computational operations. For example, processor circuit 801 may be a central processing unit (CPU) such as a microprocessor, a microcontroller, an application-specific integrated circuit (ASIC), or a field-programmable gate array (FPGA). In some embodiments, processor circuit 801 may correspond to a special purpose processing core, such as a graphics processor, audio processor, or network processor, while in other embodiments, processor circuit 801 may correspond to a general-purpose processor configured and/or programmed to perform one such function. Processor circuit 801, in some embodiments, may correspond to a processor complex that includes a plurality of general and/or special purpose processor cores.

Memory circuit 802, in the illustrated embodiment, includes one or more memory circuits for storing instructions and data to be utilized within computer system 800 by processor circuit 801. In various embodiments, memory circuit 802 may include any suitable type of memory such as a dynamic random-access memory (DRAM), a static random access memory (SRAM), a read-only memory (ROM), electrically erasable programmable read-only memory (EEPROM), or a non-volatile memory, for example. It is noted that in the embodiment of computer system 800, a single memory circuit is depicted. In other embodiments, any suitable number of memory circuits may be employed.

Input/output circuits 803 may be configured to coordinate data transfer between computer system 800 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 803 may be configured to implement a version of Universal Serial Bus (USB) protocol or IEEE 1394 (Firewire®) protocol.

Input/output circuits 803 may also be configured to coordinate data transfer between computer system 800 and one or more devices (e.g., other computing systems or integrated circuits) coupled to computer system 800 via a network. In one embodiment, input/output circuits 803 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 803 may be configured to implement multiple discrete network interface ports.

Clock generation circuit 804 may be configured to enable, configure and manage outputs of one or more clock sources. In some embodiments, clock generation circuit 804 may correspond to one of clock generation circuits 100 or 400 illustrated above in FIGS. 1 and 4, respectively. In other embodiments, clock generation circuits 100 and/or 400 may be included in clock generation circuit 804 as one of multiple clock source options in computer system 800. The clock sources may, in various embodiments, be located in analog/mixed-signal circuits 805, within clock generation circuit 804, in other blocks with computer system 800, or come from a source external to computer system 800, coupled through one or more I/O pins. In some embodiments, clock generation circuit 804 may be capable of enabling and disabling (e.g., gating) a selected clock source before it is distributed throughout computer system 800. Clock generation circuit 804 may include registers for selecting an output frequency of a phase-locked loop (PLL), delay-locked loop (DLL), frequency-locked loop (FLL), or other type of circuits capable of adjusting a frequency, duty cycle, or other properties of a clock or timing signal.

Power management circuit 806 may be configured to generate a regulated voltage level on a power supply signal for processor circuit 801, input/output circuits 803, and memory circuit 802. In various embodiments, power management circuit 806 may include one or more voltage regulator circuits, such as, e.g., a buck regulator circuit, configured to generate the regulated voltage level based on an external power supply (not shown). In some embodiments any suitable number of regulated voltage levels may be generated.

Analog/mixed-signal circuits 805 may include a variety of circuits including, for example, a crystal oscillator, PLL or FLL, and a digital-to-analog converter (DAC) (all not shown) configured to generated signals used by computer system 800. In some embodiments, analog/mixed-signal circuits 805 may also include radio frequency (RF) circuits that may be configured for operation with cellular telephone networks. Analog/mixed-signal circuits 805 may include one or more voltage regulators to supply one or more voltages to various functional blocks and circuits within those blocks It is noted that the embodiment illustrated in FIG. 8 includes one example of a computer system. A limited number of circuit blocks are illustrated for simplicity. In other embodiments, any suitable number and combination of circuit blocks may be included. For example, in other embodiments, security and/or cryptographic circuit blocks may be included.

Figure 9:
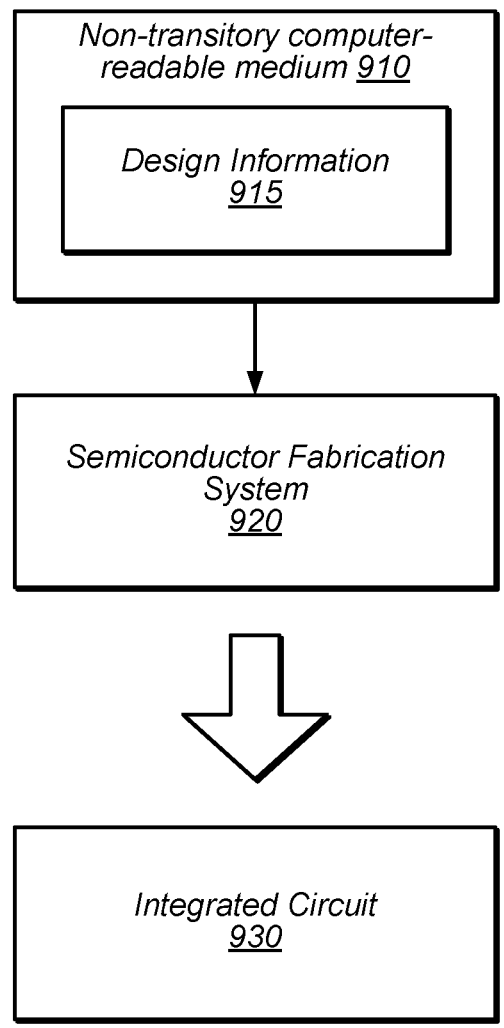
FIG. 9 is a block diagram depicting an example computer-readable medium for storing design information.

Computer system 800 may, in some embodiments, correspond to an IC that is manufactured based on design information stored in a computer-readable storage medium. FIG. 9 is a block diagram illustrating an example of a non-transitory computer-readable storage medium that stores circuit design information, such as may be utilized in the fabrication of computer system 800. The embodiment of FIG. 9 may be utilized in a process to design and manufacture, for example, an IC that includes clock generation circuit 400 of FIG. 4, further including charge pump circuit 201 or 301 of FIGS. 2 and 3, respectively. In the illustrated embodiment, semiconductor fabrication system 920 is configured to process the design information 915 stored on non-transitory computer-readable storage medium 910 and fabricate integrated circuit 930 based on the design information 915.

Non-transitory computer-readable storage medium 910, may comprise any of various appropriate types of memory devices or storage devices. Non-transitory computer-readable storage medium 910 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 910 may include other types of non-transitory memory as well or combinations thereof. Non-transitory computer-readable storage medium 910 may include two or more memory mediums, which may reside in different locations, e.g., in different computer systems that are connected over a network.

Design information 915 may be specified using any of various appropriate computer languages, including hardware description languages such as, without limitation: VHDL, Verilog, SystemC, SystemVerilog, RHDL, M, MyHDL, etc. Design information 915 may be usable by semiconductor fabrication system 920 to fabricate at least a portion of integrated circuit 930. The format of design information 915 may be recognized by at least one semiconductor fabrication system, such as semiconductor fabrication system 920, for example. In some embodiments, design information 915 may include a netlist that specifies elements of a cell library, as well as their connectivity. One or more cell libraries used during logic synthesis of circuits included in integrated circuit 930 may also be included in design information 915. Such cell libraries may include information indicative of device or transistor level netlists, mask design data, characterization data, and the like, of cells included in the cell library.

Integrated circuit 930 may, in various embodiments, include one or more custom macrocells, such as memories, analog or mixed-signal circuits, and the like. In such cases, design information 915 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 920 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 920 may also be configured to perform various testing of fabricated circuits for correct operation.

In various embodiments, integrated circuit 930 is configured to operate according to a circuit design specified by design information 915, which may include performing any of the functionality described herein. For example, integrated circuit 930 may include any of various elements shown or described herein. Further, integrated circuit 930 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   an oscillator circuit configured to generate a clock signal with a frequency that is based on a voltage level of a control node; and
   a charge pump circuit that includes a first current source and a second current source, wherein the first current source is coupled between a first supply node and a first circuit node, and wherein the second current source is coupled between a second supply node and a second circuit node, wherein the charge pump circuit is configured to:
   use a voltage level of the control node to pre-charge the first and second circuit nodes to voltage levels that differ from the control node and the first and second supply nodes;
   select, based on clock signal information, either the first or second circuit node; and
   modify, based on a voltage level of the selected circuit node, a voltage level of the control node.

2. The apparatus of claim 1, wherein to pre-charge the first and second circuit nodes, the charge pump circuit is further configured to pre-charge the first circuit node to a voltage level that is greater than a voltage level of the second circuit node.

3. The apparatus of claim 1, wherein the charge pump circuit is further configured to:
   pre-charge the first circuit node to a voltage level that is less than a voltage level of the first supply node and higher than the voltage level of the control node; and
   pre-charge the second circuit node to a voltage level that is greater than a voltage level of the second supply node and less than the voltage level of the control node.

4. The apparatus of claim 1, wherein the charge pump circuit further includes:
   a first transconductance device, coupled to the first circuit node, configured to pre-charge the first circuit node to a voltage level based on a threshold voltage of the first transconductance device; and
   a second transconductance device, coupled to the second circuit node, configured to pre-charge the second circuit node to a voltage level based on a threshold voltage of the second transconductance device.

5. The apparatus of claim 4, wherein the charge pump circuit further includes a plurality of switches, wherein a first switch of the plurality is configured to couple the first transconductance device to the first circuit node, and a second switch of the plurality is configured to couple the second transconductance device to the second circuit node.

6. The apparatus of claim 5, wherein the first switch is further configured to couple, based on the clock signal information, the first circuit node to the first transconductance device while the first circuit node is not selected; and
   wherein the second switch is further configured to couple, based on the clock signal information, the second circuit node to the second transconductance device while the second circuit node is not selected.

7. The apparatus of claim 1, wherein the charge pump circuit is further configured to increase the voltage level of the control node when the first circuit node is selected, and decrease the voltage level of the control node when the second circuit node is selected.

8. A method comprising:
   charging, by a charge pump circuit, a first circuit node to a first voltage level that is less than a voltage level of a power supply node of a clock generation circuit;

charging, by the charge pump circuit, a second circuit node to a second voltage level that is less than the first voltage level and greater than a voltage level of a ground supply node;

generating, by a phase detection circuit, phase information based on a comparison of a clock signal and a reference signal;

based on the phase information, selecting, by the charge pump circuit, at least one of the first and second circuit nodes;

adjusting, by the charge pump circuit, a voltage level of a control node based on a voltage level of the selected circuit node; and generating, by an oscillator circuit, a clock signal with a frequency that is based on the voltage level of the control node.

9. The method of claim 8, further comprising adjusting the voltage level of the control node by coupling the selected circuit node to the control node.

10. The method of claim 9, further comprising increasing the voltage level of the control node by coupling the control node to the first circuit node, and decreasing the voltage level of the control node by coupling the control node to the second circuit node.

11. The method of claim 10, further comprising increasing the frequency of the clock signal by increasing the voltage level of the control node, and decreasing the frequency of the clock signal by decreasing the voltage level of the control node.

12. The method of claim 9, further comprising ceasing the charging of the selected ones of the first and second circuit nodes while the selected circuit node is coupled to the control node.

13. The method of claim 8, further comprising charging the first circuit node to a voltage level that is less than a voltage level of the power supply node and higher than a voltage level of the control node.

14. The method of claim 8, further comprising charging the second circuit node to a voltage level that is greater than a voltage level of the ground supply node and less than a voltage level of the control node.

15. An apparatus, comprising:
a first current source coupled to a power supply node and to a first circuit node;
a second current source coupled to a ground supply node and to a second circuit node;
a first transconductance device coupled to the first circuit node and to the ground supply node, wherein the first transconductance device is configured to pre-charge the first circuit node a first voltage level;
a second transconductance device coupled to the second circuit node and to the power supply node, wherein the second transconductance device is configured to pre-charge the second circuit node to a second voltage level that is less than the first voltage level; and
a plurality of switches configured to selectively couple one or more of the first and second circuit nodes to a control node based on received phase information.

16. The apparatus of claim 15, wherein the first voltage level is less than a voltage level of the power supply node and higher than a voltage level of the control node, and the second voltage level is greater than a voltage level of the ground supply node and less than the voltage level of the control node.

17. The apparatus of claim 15, further comprising a different switch configured to couple the first transconductance device to the first circuit node while the first circuit node is not selectively coupled to the control node.

18. The apparatus of claim 17, wherein the phase information includes a first phase input signal, and wherein the different switch is configured to couple the first transconductance device to the first circuit node in response to a de-assertion of the first phase input signal.

19. The apparatus of claim 15, wherein the first and second transconductance devices are each a complementary metal-oxide-semiconductor (CMOS) transistor, and wherein to pre-charge the first and second circuit nodes, the first and second transconductance devices are configured to pre-charge the first and second circuit nodes, respectively, based on a gate-to-source threshold voltage of the respective CMOS transistor.

20. The apparatus of claim 15, wherein a respective control terminal of the first and second transconductive devices is coupled to the control node.

* * * * *